(12) United States Patent
Xu et al.

(10) Patent No.: US 9,780,257 B1
(45) Date of Patent: Oct. 3, 2017

(54) METHOD OF PREPARING QUANTUM DOT LAYER, QLED DISPLAY DEVICE HAVING THE QUANTUM DOT LAYER AND METHOD OF PREPARING THE SAME

(71) Applicant: BOE TECHNOLOGY GROUP CO., LTD., Beijing (CN)

(72) Inventors: Xiaona Xu, Beijing (CN); Tian Yang, Beijing (CN); Biao Tian, Beijing (CN); Zhao Kang, Beijing (CN); Xiaoyan Zhu, Beijing (CN); Ning Chen, Beijing (CN); Xiang Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/224,234

(22) Filed: Jul. 29, 2016

(30) Foreign Application Priority Data

Mar. 16, 2016 (CN) .......................... 2016 1 0151173

(51) Int. Cl.
*H01L 33/06* (2010.01)
*H01L 33/62* (2010.01)
*H01L 33/44* (2010.01)

(52) U.S. Cl.
CPC .............. *H01L 33/06* (2013.01); *H01L 33/44* (2013.01); *H01L 33/62* (2013.01); *H01L 2933/0025* (2013.01); *H01L 2933/0033* (2013.01); *H01L 2933/0066* (2013.01)

(58) Field of Classification Search
CPC ......... H01L 33/06; H01L 33/04; H01L 33/44; H01L 33/62; H01L 2933/0025; H01L 2933/0033; H01L 2933/0066

USPC ............................................. 438/47
See application file for complete search history.

(56) References Cited

U.S. PATENT DOCUMENTS

| | | | | |
|---|---|---|---|---|
| 8,222,061 B2 * | 7/2012 | Xu | ............ | B22F 9/026 257/E31.038 |
| 2008/0318003 A1 * | 12/2008 | Chua | ............ | B82Y 10/00 428/141 |
| 2011/0269298 A1 * | 11/2011 | Holme | ............ | B82Y 10/00 438/478 |
| 2014/0272280 A1 * | 9/2014 | Afzulpurkar | ............ | C25D 11/12 428/119 |

FOREIGN PATENT DOCUMENTS

| | | |
|---|---|---|
| CN | 101037783 A | 9/2007 |
| CN | 101461285 A | 6/2009 |
| CN | 101654799 A | 2/2010 |
| CN | 103824898 A | 5/2014 |

(Continued)

OTHER PUBLICATIONS

Bandyopadhyay et al. ("Electrochemically Assembled Quasi-Periodic Quantum Dot Array," Nanotechnology 7, pp. 360-371, 1996).*

(Continued)

*Primary Examiner* — Yasser A Abdelaziez
(74) *Attorney, Agent, or Firm* — Kinney & Lange, P.A.

(57) ABSTRACT

A method of preparing a quantum dot layer, including: placing an anodic aluminum oxide sheet with a plurality of through holes on a substrate; dispersing quantum dots into the plurality of through holes of the anodic aluminum oxide sheet; and removing the anodic aluminum oxide sheet to form a quantum dot layer.

19 Claims, 2 Drawing Sheets

(56) References Cited

FOREIGN PATENT DOCUMENTS

CN      105244451 A       1/2016
DE      202013011005 U1   3/2014

OTHER PUBLICATIONS

Masuda et al. ("Fabrication of Gold Nanodot Array using Anodic Porous Alumina and an Evaporation Mask," Jpn. J. of Appl. Physics, vol. 35, Part 2, No. 1B, pp. L126-L129, Jan. 1996).*
Beng et al. ("Dots deliver beautiful whites," Compound Semicoductor magazine, vol. 16 No. 8, pp. 40-43, 2010).*
Kashi et al. ("Optimum self-ordered nano-pore arrays with 103-2070nm interpore distances formed by hard anodization in sulfuric/oxalic acid mixtures," J. of Physics D: Applied Physics, 40, pp. 7032-7040, 2007).*
Belwalker et al. ("Effect of processing parameters on pore structure and thickness of anodic aluminum oxide AAO tubular membranes," J. of Membrane Science, 319(1-2), pp. 192-198, 2008).*
Lin, Ge "Study on All-Inorganic Light Emitting Devices Based on ZnO Nanorods with Modification of SiO2", China Academic Journal Electronic Publishing House, vol. 33, No. 8, dated Aug. 2013, 6 pages.
First Chinese Office Action, for Chinese Patent Application No. 201610151173.2, dated Apr. 24, 2017, 12 pages.
Second Chinese Office Action, for Chinese Patent Application No. 201610151173.2 dated Aug. 15, 2017, 10 pages.

\* cited by examiner

METHOD OF PREPARING QUANTUM DOT LAYER, QLED DISPLAY DEVICE HAVING THE QUANTUM DOT LAYER AND METHOD OF PREPARING THE SAME

CROSS-REFERENCE TO RELATED APPLICATION

This application claims the benefit of Chinese Patent Application No. 201610151173.2 filed on Mar. 16, 2016 in the State Intellectual Property Office of China, the whole disclosure of which is incorporated herein by reference.

BACKGROUND OF THE INVENTION

Field of the Invention

Embodiments of the present disclosure relates to a field of display technology, in particular, to a method of preparing a quantum dot layer, a quantum dot light emitting diode (QLED) display device having the quantum dot layer and a method of preparing the QLED display device.

Description of the Related Art

Quantum dot, also referred as nano-crystal, refers to a nano-particle which has nano-scale sizes (i.e. 1 nm to 100 nm) in three dimensions. Due to quantum confinement effect, quantum dot has physical and chemical properties different from macro-material. Quantum dot plays an important role in a research of nano-material structure, synthesis and preparation of nano-material and nano-device.

A quantum dot light emitting diode (QLED) display device is a novel display technology developed on a basis of organic light emitting diode (OLED) display device, and is characterized in that a quantum dot layer is used as an electroluminescent structure. In principle, electrons are injected into the quantum dot layer via an electron transport layer while holes are injected into the quantum dot layer via a hole transport layer, so that the electrons and the holes are recombined in the quantum dot to emit light. Compared to the OLED display device, the QLED display device has advantages such as narrow luminous peak, high color saturation, broad color range, etc.

However, there is a big problem in an application of the QLED display device, that is, quantum dots tend to be aggregated so that defects such as self-quenching, low luminous efficiency, short life time or the like may occur. Therefore, during preparing a QLED display device, a problem to be solved is how to disperse and stabilize quantum dots in the QLED display device.

SUMMARY OF THE INVENTION

According to an aspect of the present disclosure, it is provided a method of preparing a quantum dot layer, comprising:

placing an anodic aluminum oxide sheet with a plurality of through holes on a substrate;

dispersing quantum dots into the plurality of through holes of the anodic aluminum oxide sheet; and removing the anodic aluminum oxide sheet to form a quantum dot layer.

In an embodiment, the anodic aluminum oxide sheet is removed by means of dissolution.

In an embodiment, the anodic aluminum oxide sheet is removed by means of being immersed in an acid or alkali solution of a low concentration.

In an embodiment, the low concentration comprises a concentration range of from 5 wt. % to 10 wt. %; the acid solution is selected from hydrochloric acid solution or phosphoric acid solution; and the alkali solution is NaOH solution.

In an embodiment, the anodic aluminum oxide sheet is prepared by using a method comprising:

S1. cleaning an aluminum sheet and placing the cleaned aluminum sheet into a first mixed solution to electropolish it;

S2. placing the electropolished aluminum sheet into oxalic acid solution to conduct a first anodic oxidation, so as to form a first sheet;

S3. placing the first sheet into a second mixed solution to conduct a water bath, so as to remove an aluminum oxide film formed on a surface of the first sheet, and then placing the first sheet into oxalic acid solution to conduct a second anodic oxidation, so as to form a second sheet;

S4. placing the other surface of the second sheet, on which aluminum is not oxidized, into a saturated copper chloride solution to conduct a replacement reaction so as to remove the aluminum completely, to form a third sheet; and S5. forming the through holes in the third sheet by using phosphoric acid to form the anodic aluminum oxide sheet.

In an embodiment, in the step S1, the first mixed solution is prepared by mixing absolute ethanol and perchloric acid with 4 to 1:1 by volume, and the electropolishing is conducted at a voltage in a range of from 15V to 18V.

In an embodiment, in the step S2, the oxalic acid solution has a concentration range of 0.3 mM to 1 mM, and the first anodic oxidation is conducted at a voltage in a range of from 40V to 50V and lasts for 3 to 4 hours.

In an embodiment, in the step S3, the second mixed solution is prepared by mixing 1.8 wt. % chromic acid and 6 wt. % phosphoric acid.

In an embodiment, in the step S3, the second anodic oxidation is conducted at a voltage in a range of from 20V to 50V and lasts for 20 minutes to 48 hours.

In an embodiment, in the step S5, the phosphoric acid has a concentration range of 5 wt. % to 10 wt. %, and the through holes are formed within a time range of from 4 to 10 hours.

In an embodiment, in the step S5, diameters of the through holes are controlled to be within a range of from 5 nm to 200 nm.

In an embodiment, the quantum dots are dispersed into the plurality of through holes of the anodic aluminum oxide sheet by means of drop-in or spin-coating.

According to another aspect of the present disclosure, it is further provided a method of preparing a quantum dot light emitting diode display device, comprising:

forming a hole transport layer;

placing an anodic aluminum oxide sheet with a plurality of through holes on the hole transport layer;

dispersing quantum dots into the plurality of through holes of the anodic aluminum oxide sheet; and removing the anodic aluminum oxide sheet to form a quantum dot layer on the hole transport layer.

In an embodiment, before forming the hole transport layer, the method may further comprise:

providing a substrate; and forming an anode and a hole blocking layer on the substrate in that order.

In an embodiment, after forming the quantum dot layer, the method may further comprise:

forming an electron transport layer, an electron blocking layer and a cathode on the quantum dot layer in that order.

According to another aspect of the present disclosure, it is further provided a method of preparing a quantum dot light emitting diode display device, comprising:

forming a hole transport layer;

forming a protective layer on the hole transport layer;

placing an anodic aluminum oxide sheet with a plurality of through holes on the protective layer;

dispersing quantum dots into the plurality of through holes of the anodic aluminum oxide sheet; and removing the anodic aluminum oxide sheet to form a quantum dot layer on the protective layer.

In an embodiment, the protective layer is one selected from p-type doping protective layer, n-type doping protective layer and anisotropic conductive layer.

In an embodiment, before forming the hole transport layer, the method may further comprise:

providing a substrate; and forming an anode and a hole blocking layer on the substrate in that order.

In an embodiment, after forming the quantum dot layer, the method may further comprise:

forming an electron transport layer, an electron blocking layer and a cathode on the quantum dot layer in that order.

According to another further aspect of the present disclosure, it is further provided a quantum dot light emitting diode display device, which is prepared by the method according to any one of the above embodiments.

DETAILED DESCRIPTION OF PREFERRED EMBODIMENTS OF THE INVENTION

The following embodiments are intended to explain the present disclosure, rather than limiting the scope of the present invention.

According to an embodiment of the present disclosure, it is provided a method of preparing a quantum dot layer, comprising: placing an anodic aluminum oxide (AAO) sheet with a plurality of through holes on a substrate; dispersing quantum dots into the plurality of through holes of the anodic aluminum oxide sheet; and removing the anodic aluminum oxide sheet to form a quantum dot layer.

Figure 2:
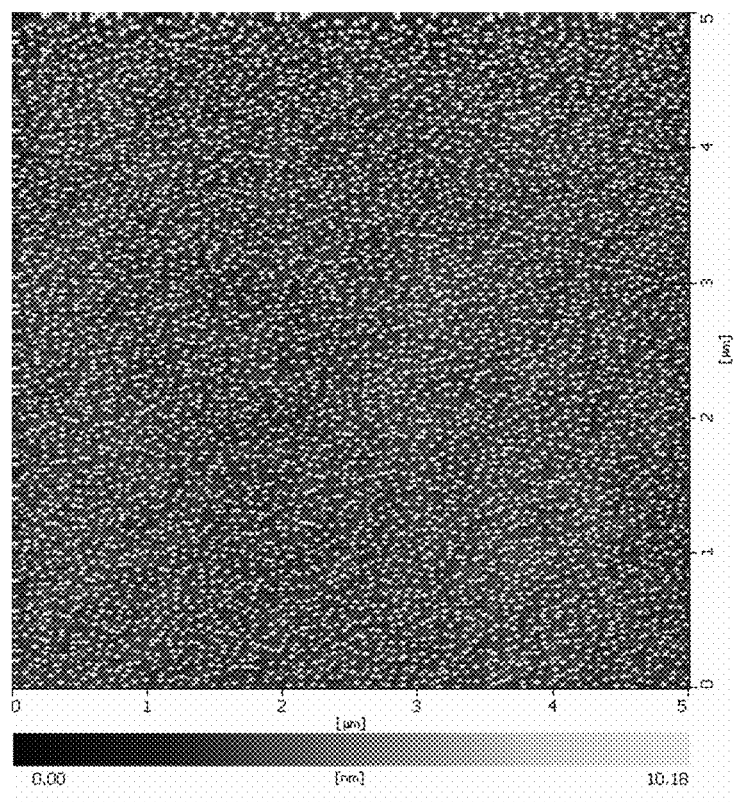
FIG. 2 is an atomic force microscope (AFM) diagram of a quantum dot layer prepared by a method according to an embodiment of the present disclosure.

FIG. 2 is an atomic force microscope (AFM) diagram of a quantum dot layer prepared by a method according to an embodiment of the present disclosure, as shown in FIG. 2, quantum dots are dispersed and stabilized in the prepared quantum dot layer, so that they are not easily aggregated.

In an embodiment, the quantum dots are dispersed into the plurality of through holes of the anodic aluminum oxide sheet by means of drop-in or spin-coating. However, it should be understood that the quantum dots may be dispersed into the plurality of through holes of the anodic aluminum oxide sheet by means of any other manners.

In the embodiment, the quantum dots can be dispersed and stabilized in the quantum dot layer prepared by using the anodic aluminum oxide sheet, so as to solve a problem that the quantum dots are easy to be aggregated.

According to an embodiment of the present disclosure, the anodic aluminum oxide sheet may be removed by means of being immersed in an acid or alkali solution of a low concentration. Specifically, the low concentration here may comprise a concentration range of from 5 wt. (by weight) % to 10 wt. %, the acid solution may be selected from hydrochloric acid solution or phosphoric acid solution, and the alkali solution may be NaOH solution.

The anodic aluminum oxide sheet may be prepared by using a method comprising:

S1. cleaning a highly purified aluminum sheet and placing the cleaned aluminum sheet into a first mixed solution to electropolish it.

In the step S1, the cleaning step specifically comprises ultrasonically cleaning the highly purified aluminum sheet (for example, with a purity of 99.999%) in acetone for 1 minute. The first mixed solution may be prepared by mixing absolute ethanol and perchloric acid with 4 to 1:1 (i.e. 4~1:1) by volume, preferably, with 4:1 by volume, with such a ratio, the mixed solution may ensure a cleaning effect to a highest extent. And the electropolishing is conducted at a voltage in a range of from 15V to 18V.

S2. placing the electropolished aluminum sheet into oxalic acid solution of 0.4 mM (mmol/L) to conduct a first anodic oxidation in which the aluminum sheet is used as an anode and a platinum sheet is used as a cathode, so as to form a first sheet.

Specifically, the first anodic oxidation may be conducted at a voltage in a range of from 40V to 50V and lasts for 3 to 4 hours.

S3. placing the first sheet into a second mixed solution to conduct a water bath at a temperature range of from 60° C. to 80° C., so as to remove an aluminum oxide film formed on a surface of the first sheet, and placing the first sheet into oxalic acid solution to conduct a second anodic oxidation, so as to form a second sheet.

Specifically, the second mixed solution is prepared by mixing 1.8 wt. % chromic acid and 6 wt. % phosphoric acid, with such a ratio, the second mixed solution may remove activated points formed on the Al sheet surface during the first anodic oxidation. The second anodic oxidation is conducted at a voltage of 50V and lasts for 4 hours. Through the second anodic oxidation, a dense, high-resistivity aluminum oxide layer is formed on the Al sheet surface.

S4. placing the other surface of the second sheet (i.e. a surface of the sheet opposite to the above surface of the first sheet in step S3) on which aluminum is not oxidized into a saturated copper chloride solution to conduct a replacement reaction so as to remove the aluminum completely, to form a third sheet.

S5. forming the through holes in the third sheet by using 5 wt. % phosphoric acid to form the anodic aluminum oxide sheet.

Specifically, it takes 4 to 10 hours to form the through holes.

After being processed by the phosphoric acid, nano-size through holes, which have uniform diameters and are highly orderly distributed, are formed in the sheet. During forming the through holes, diameters of the formed through holes can be controlled by adjusting a concentration of the phosphoric acid and the period required to form the through holes. In this way, the diameters of the formed through holes of the AAO sheet prepared by using the above method are controllable to be within a range of from 5 nm to 200 nm, more particularly, within 100 nm. Further, the through holes have uniform diameters and are highly orderly distributed.

Figure 1:
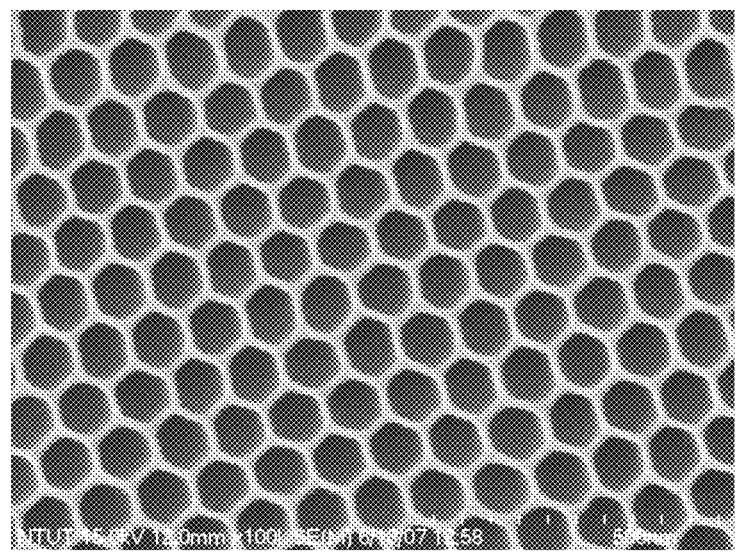
FIG. 1 is a scanning electron microscope (SEM) diagram of the an anodic aluminum oxide (AAO) sheet prepared by a method according to an embodiment of the present disclosure.

FIG. 1 is a scanning electron microscope (SEM) diagram of the AAO sheet prepared by using the above method. As shown in FIG. 1, the nano-size through holes of the AAO sheet are neatly and densely arranged, are highly ordered, are perpendicular to a surface of the sheet and penetrate the sheet. The through holes do not overlap with one another. The diameters of the through holes are within a range of from several nanometers to hundreds of nanometers, and depths thereof are about dozens of microns.

The quantum dots in the quantum dot layer may include: CdS, CdSe, CdTe, ZnO, ZnS, ZnSe and ZnTe of the group II-VI, GaAs, GaP, GaAs, GaSb, HgS, HgSe, HgTe, InAs, InP, InSb, AlAs, AlP and AlSb of the group III-V, and quantum dots with single-layer, double-layer or multi-layer core-shell structure consisting of quantum dots with different components, more particularly, CdSe/CdS or CdSe/CdS/ZnS. By adjusting sizes of the quantum dots, the quantum dots, which are excited by light to emit light with different colors, may be obtained.

Further, an embodiment of the present disclosure provides a method of preparing a quantum dot light emitting diode (QLED) display device, comprising: forming a hole transport layer; placing an anodic aluminum oxide sheet with a plurality of through holes on the hole transport layer; dispersing quantum dots into the plurality of through holes of the anodic aluminum oxide sheet; and removing the anodic aluminum oxide sheet to form a quantum dot layer on the hole transport layer.

The method of preparing a QLED display device will be further described in detail with reference to FIGS. 3 and 4. The method may comprise steps of:

providing a substrate 1;

forming an anode 2, a hole blocking layer 4 and a hole transport layer 6 on the substrate 1 in that order;

placing an anodic aluminum oxide sheet (as shown in FIG. 1) with a plurality of through holes on the hole transport layer 6;

dispersing quantum dots into the plurality of through holes of the anodic aluminum oxide sheet;

removing the anodic aluminum oxide sheet to form a quantum dot layer 10 on the hole transport layer 6; and forming an electron transport layer 12, an electron blocking layer 14 and a cathode 16 on the quantum dot layer 10 in that order.

Figure 3:
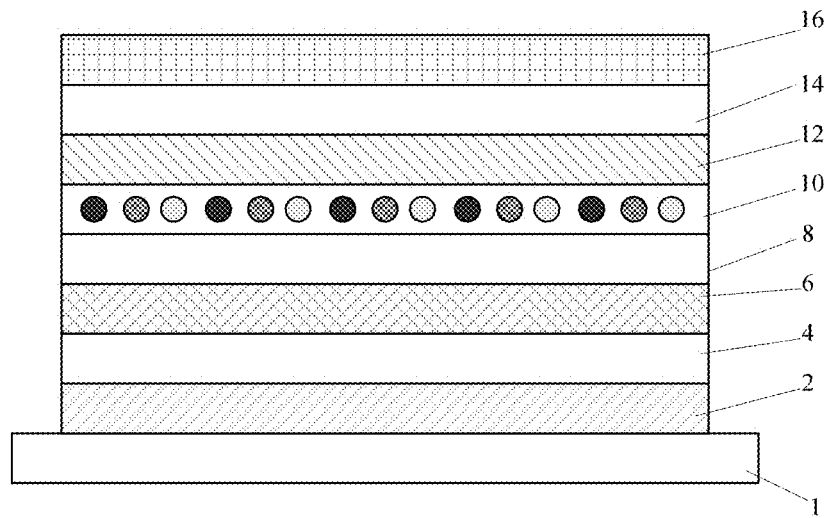
FIG. 3 is a schematic structural view of a quantum dot light emitting diode (QLED) display device prepared by a method according to an embodiment of the present disclosure.
Figure 4:
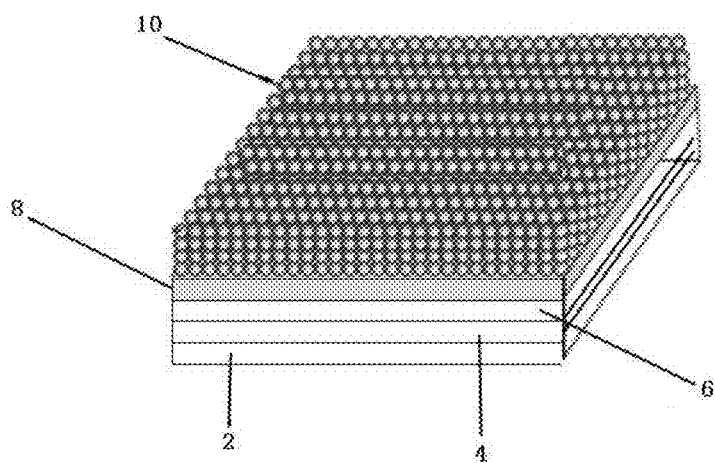
FIG. 4 is a schematic structural view of a part of a QLED display device prepared by a method according to an embodiment of the present disclosure.

As shown in FIG. 3, the QLED display device prepared by the above method may comprise a substrate 1, an anode 2, a hole blocking layer 4, a hole transport layer 6, a quantum dot layer 10, an electron transport layer 12, an electron blocking layer 14 and a cathode 16 arranged in that order.

In this way, when the QLED display device is in operation, on one hand, electrons are injected into the electron blocking layer from the cathode under an effect of external electrical field so as to be injected into the electron transport layer and then into the quantum dot layer; on the other hand, holes are injected into the hole blocking layer from the anode so as to be injected into the hole transport layer and then into the quantum dot layer. The electrons and the holes in the quantum dot layer are formed into excitons, and the excitons are recombined to enable the quantum dots to emit light. Red light, green light and blue light emitted by the quantum dots are mixed to form white light.

According to another embodiment of the present disclosure, it is further provided a method of preparing a QLED display device, comprising: forming a hole transport layer; forming a protective layer on the hole transport layer; placing an anodic aluminum oxide sheet with a plurality of through holes on the protective layer; dispersing quantum dots into the plurality of through holes of the anodic aluminum oxide sheet; and removing the anodic aluminum oxide sheet to form a quantum dot layer on the protective layer.

The method of preparing a QLED display device will be further described in detail with reference to FIGS. 3 and 4. The method may comprise steps of:

providing a substrate 1;

forming an anode 2, a hole blocking layer 4, a hole transport layer 6 and a protective layer 8 on the substrate 1 in that order;

placing an anodic aluminum oxide sheet (as shown in FIG. 1) with a plurality of through holes on the protective layer 8;

dispersing quantum dots into the plurality of through holes of the anodic aluminum oxide sheet;

removing the anodic aluminum oxide sheet to form a quantum dot layer 10 on the protective layer 8; and forming an electron transport layer 12, an electron blocking layer 14 and a cathode 16 on the quantum dot layer 10 in that order.

In the method of preparing the QLED display device according to embodiments of the present disclosure, the protective layer is formed between the hole transport layer and the quantum dot layer, so that organic layers such as the hole transport layer can be protected from being damaged, more particularly, the organic layers can be protected from being damaged by the acid or alkali solution during dissolving the AAO sheet. Further, the protective layer allows the holes or electrons to be effectively transported and reduces potential barrier so as to facilitate transporting the holes or electrons.

In an embodiment, the protective layer 8 may be one selected from p-type doping protective layer, n-type doping protective layer and anisotropic conductive layer.

In the embodiment, the protective layer is formed between the hole transport layer and the quantum dot layer, and the protective layer is one selected from p-type doping protective layer, n-type doping protective layer and anisotropic conductive layer. Hereby, on one hand, the p-type doping protective layer or the n-type doping protective layer can allow the protective layer to be rich in holes so that holes or electrons are allowed to be effectively transported and potential barrier can be reduced so as to facilitate transporting the holes or electrons; on the other hand, the p-type doping protective layer or the n-type doping protective layer has a good acid resistance or alkali resistance so that it can protect organic layers such as the hole transport layer or the like from being damaged by the acid or alkali solution during dissolving the AAO sheet. As an example, the protective layer may be IGZO, which has a filming temperature of from 25° C. to 100° C., a good alkali resistance and can allow the holes or electrons to be effectively transported. The anisotropic conductive layer is advantageous in that there is a distinct difference between resistance characteristics in a conductive Z-direction and in an insulative X-Y plane. If the difference between the resistance in the conductive Z-direction and the resistance in the insulative X-Y plane exceeds a certain value, not only two electrodes can be connected with each other via conductive particles so as to be conductive but also a short circuit can be avoided between two adjacent electrodes, so that the conduction is generated only in the Z-direction. As an example, the anisotropic conductive layer may be active carbon fiber, which has a good acid resistance and alkali resistance, and allows the conduction in the Z-direction, so that the holes or electrons are allowed to be effectively transported.

As shown in FIG. 3, the QLED display device prepared by the above method may comprise a substrate 1, an anode 2, a hole blocking layer 4, a hole transport layer 6, a protective layer 8, a quantum dot layer 10, an electron transport layer 12, an electron blocking layer 14 and a cathode 16 arranged in that order.

In the present disclosure, the quantum dot layer is prepared by using the anodic aluminum oxide sheet, so that quantum dots in the prepared quantum dot layer are evenly distributed and emit light uniformly, as a result, luminous intensity and life time of the quantum dots can be effectively improved, thereby further increasing luminous efficiency of the QLED display device.

Through performance tests on the QLED display devices prepared by the above methods according to embodiments of the present disclosure, it can be found that: all the prepared QLED display devices present good luminous intensity and long life time, and luminous efficiency of the display device is obviously increased. More particularly, the QLED display device which comprises the protective layer has the best display effect.

Though the anodic aluminum oxide sheet with a plurality of through holes prepared by a particular method is utilized in the above embodiments, in other embodiments, a common commercially available anodic aluminum oxide sheet or an anodic aluminum oxide sheet prepared by a widely used electrochemical oxidation-anodic oxidation method may be utilized.

Though the present invention has been described by using the general description and specific embodiments as stated above, it is obvious for those skilled in the art that various modifications or changes may be made thereto. Therefore, these modifications or changes made without departing from a spirit of the present invention shall fall into the scope of the present invention.

What is claimed is:
1. A method of preparing a quantum dot light emitting diode display device, comprising:
  forming a hole transport layer;
  placing an anodic aluminum oxide sheet with a plurality of through holes on the hole transport layer, wherein a diameter of each through hole is larger than a thickness of a partition wall between any two adjacent through holes;
  dispersing quantum dots into the plurality of through holes of the anodic aluminum oxide sheet; and
  removing the anodic aluminum oxide sheet to form a quantum dot layer on the hole transport layer.
2. The method according to claim 1, before forming the hole transport layer, further comprising:
  providing a substrate; and
  forming an anode and a hole blocking layer on the substrate in that order.
3. The method according to claim 2, after forming the quantum dot layer, further comprising:
  forming an electron transport layer, an electron blocking layer and a cathode on the quantum dot layer in that order.
4. A method of preparing a quantum dot light emitting diode display device, comprising:
  forming a hole transport layer;
  forming a protective layer on the hole transport layer;
  placing an anodic aluminum oxide sheet with a plurality of through holes on the protective layer, wherein a diameter of each through hole is larger than a thickness of a partition wall between any two adjacent through holes;
  dispersing quantum dots into the plurality of through holes of the anodic aluminum oxide sheet; and
  removing the anodic aluminum oxide sheet to form a quantum dot layer on the protective layer.
5. The method according to claim 4, wherein, the protective layer is one selected from p-type doping protective layer, n-type doping protective layer and anisotropic conductive layer.
6. The method according to claim 4, before forming the hole transport layer, further comprising:
  providing a substrate; and
  forming an anode and a hole blocking layer on the substrate in that order.
7. The method according to claim 6, after forming the quantum dot layer, further comprising:
  forming an electron transport layer, an electron blocking layer and a cathode on the quantum dot layer in that order.
8. A quantum dot light emitting diode display device, which is prepared by the method according to claim 7.
9. The method according to claim 1, wherein the anodic aluminum oxide sheet is removed by dissolution.
10. The method according to claim 9, wherein the anodic aluminum oxide sheet is removed by being immersed in an acid or alkali solution of a low concentration.
11. The method according to claim 10, wherein:
  the low concentration comprises a concentration range of from 5 wt. % to 10 wt. %;
  the acid solution is selected from hydrochloric acid solution or phosphoric acid solution; and
  the alkali solution is NaOH solution.
12. The method according to claim 1, wherein the anodic aluminum oxide sheet is prepared by using a method comprising:
  S1. cleaning an aluminum sheet and placing the cleaned aluminum sheet into a first mixed solution to electropolish it;
  S2. placing the electropolished aluminum sheet into oxalic acid solution to conduct a first anodic oxidation, so as to form a first sheet;
  S3. placing the first sheet into a second mixed solution to conduct a water bath, so as to remove an aluminum oxide film formed on a first surface of the first sheet, and then placing the first sheet into oxalic acid solution to conduct a second anodic oxidation, so as to form a second sheet;
  S4. placing a second surface of the second sheet, on which aluminum is not oxidized, into a saturated copper chloride solution to conduct a replacement reaction so as to remove the aluminum completely, to form a third sheet; and
  S5. forming the through holes in the third sheet by using phosphoric acid to form the anodic aluminum oxide sheet.
13. The method according to claim 12, wherein, in the step S1, the first mixed solution is prepared by mixing absolute ethanol and perchloric acid with 4 to 1:1 by volume, and the electropolishing is conducted at a voltage in a range of from 15V to 18V.
14. The method according to claim 12, wherein, in the step S2, the oxalic acid solution has a concentration range of

0.3 mM to 1 mM, and the first anodic oxidation is conducted at a voltage in a range of from 40V to 50V and lasts for 3 to 4 hours.

15. The method according to claim 12, wherein, in the step S3, the second mixed solution is prepared by mixing 1.8 wt. % chromic acid and 6 wt. % phosphoric acid.

16. The method according to claim 12, wherein, in the step S3, the second anodic oxidation is conducted at a voltage in a range of from 20V to 50V and lasts for 20 minutes to 48 hours.

17. The method according to claim 12, wherein, in the step S5, the phosphoric acid has a concentration range of 5 wt. % to 10 wt. %, and the through holes are formed within a time range of from 4 to 10 hours.

18. The method according to claim 12, wherein, in the step S5, diameters of the through holes are controlled to be within a range of from 5 nm to 200 nm.

19. The method according to claim 1, wherein, the quantum dots are dispersed into the plurality of through holes of the anodic aluminum oxide sheet by drop-in or spin-coating.

\* \* \* \* \*